(12) United States Patent
Jo et al.

(10) Patent No.: US 10,505,579 B2
(45) Date of Patent: Dec. 10, 2019

(54) RADIO FREQUENCY SWITCHING DEVICE FOR FAST SWITCHING OPERATION

(71) Applicant: Samsung Electro-Mechanics Co., Ltd., Suwon-si (KR)

(72) Inventors: Byeong Hak Jo, Suwon-si (KR); Hyun Paek, Suwon-si (KR); Jeong Hoon Kim, Suwon-si (KR); Yoo Hwan Kim, Suwon-si (KR); Yoo Sam Na, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/237,834

(22) Filed: Jan. 2, 2019

(65) Prior Publication Data

US 2019/0245574 A1 Aug. 8, 2019

(30) Foreign Application Priority Data

Feb. 2, 2018 (KR) .................. 10-2018-0013513
Jul. 9, 2018 (KR) .................. 10-2018-0079486

(51) Int. Cl.
*H04M 1/00* (2006.01)
*H04B 1/40* (2015.01)
(Continued)

(52) U.S. Cl.
CPC .............. *H04B 1/40* (2013.01); *H03K 17/28* (2013.01); *H03K 17/6874* (2013.01); *H03K 17/693* (2013.01)

(58) Field of Classification Search
CPC ...... H04B 1/40; H03K 17/28; H03K 17/6874; H03K 17/693
(Continued)

(56) References Cited

U.S. PATENT DOCUMENTS 7,613,442 B1 11/2009 Kelly et al.
2004/0085118 A1 5/2004 Numata
(Continued)

FOREIGN PATENT DOCUMENTS

JP 5785461 B2 9/2015
JP 2017-112537 A 6/2017
(Continued)

OTHER PUBLICATIONS

Korean Office Action dated Apr. 15, 2019 in corresponding Korean Patent Application No. 10-2018-0079486 (5 pages in English, 4 pages in Korean).
(Continued)

*Primary Examiner* — Pakee Fang
(74) *Attorney, Agent, or Firm* — NSIP Law

(57) ABSTRACT

A radio frequency switching device includes a switching circuit including first and second transistors; a gate resistor circuit including a first gate resistor and a second gate resistor, the first gate resistor connected to a gate of the first transistor and the second gate resistor connected to a gate of the second transistor; a gate buffer circuit including a first gate buffer and a second gate buffer, the first gate buffer being connected to the first gate resistor to provide a first gate signal to the first transistor through the first gate resistor, the second gate buffer being connected to the second gate resistor to provide a second gate signal to the second transistor through the second gate resistor; and a delay circuit to generate the first gate signal having a first switching time and the second gate signal having a second switching time different than the first switching time.

14 Claims, 13 Drawing Sheets

(51) Int. Cl.
*H03K 17/687* (2006.01)
*H03K 17/28* (2006.01)
*H03K 17/693* (2006.01)

(58) Field of Classification Search
USPC .................................................... 455/552.1
See application file for complete search history.

(56) References Cited

U.S. PATENT DOCUMENTS

| 2005/0248384 | A1* | 11/2005 | Miettinen | H03K 17/0406 |
| | | | | 327/434 |
| 2017/0179848 | A1* | 6/2017 | Shimizu | H01L 27/0629 |
| 2018/0145679 | A1 | 5/2018 | Kim et al. | |
| 2018/0269806 | A1* | 9/2018 | Chen | G01K 7/22 |
| 2018/0331682 | A1* | 11/2018 | Duduman | H03K 17/063 |

FOREIGN PATENT DOCUMENTS

| KR | 10-0904335 B1 | 6/2009 |
| KR | 10-1823268 B1 | 1/2018 |
| WO | WO 87/03153 A1 | 5/1987 |

OTHER PUBLICATIONS

Yoon, Sang-Woong, "Static and Dynamic Error Vector Magnitude Behavior of 2.4-GHz Power Amplifier", *IEEE Transactions on Microwave Theory and Techniques*, vol. 55, No. 4, Apr. 2007 (pp. 643-647).

Gu, Zeji et al., "Enhanced Linearity and Efficiency of HBT MMIC Power Amplifiers for WCDMA Applications", *Proceedings of the 40th European Microwave Conference*, Paris, France, Sep. 28-30, 2010 (pp. 1002-1005).

* cited by examiner

RADIO FREQUENCY SWITCHING DEVICE FOR FAST SWITCHING OPERATION

CROSS-REFERENCE TO RELATED APPLICATIONS

This application claims the benefit under 35 U.S.C. 119(a) of Korean Patent Application No. 10-2018-0079486 filed on Jul. 9, 2018 and Korean Patent Application No. 10-2018-0013513 filed on Feb. 2, 2018 in the Korean Intellectual Property Office, the entire disclosures of which are incorporated herein by reference for all purposes.

BACKGROUND

1. Field

The following description relates to a radio frequency (RF) switching device for a fast switching operation.

2. Description of Background

Generally, a power amplifier (PA) may include a radio frequency (RF) switching device, and a radio frequency (RF) circuit, the radio frequency (RF) switching device may be applied to a PA using a time division duplex (TDD) method. An RF switching device applied to a PA using a TDD method may switch a transmit (TX) operation and a receive (RX) operation in different time periods by dividing an operational time.

As the PA using a TDD method may perform the switching operation to alternately connect a transmit (TX) operation and a receive (RX) operation in a short period of time, a switching time may be important to operational performance.

A general RF switching device may include a series switch and a shunt switch, and a gate resistor may be connected to gates of the series switch and the shunt switch. The gate resistor may be connected to a gate buffer. The gate resistor may prevent degradation of isolation of switches caused by a large signal received through the gate buffer and applied to the series switch and the shunt switch.

The switching time may be determined by a value of the gate resistor connected to each gate of the switches and a capacitance shown in the gate. In the case in which the switch is a field effect transistor (FET), the capacitor may have gate-source capacitance (Cgs) or gate-drain capacitance (Cgd) of an FET.

A size of an FET may be determined based on properties such as insertion loss, and the like, of the FET. Once a size of the FET is determined, capacitance may be determined physically, and when a specification of the switching time is determined, the value of the gate resistor may be determined. Accordingly, depending on the value of the gate resistor, a trade-off relationship between the switching time and the isolation properties may be established. For example, if the switching time is more important than the isolation properties in a system, the isolation properties may degrade.

In a general RF switch, in the case in which a value of the gate resistor is maintained at a certain value to prevent degradation of the isolation properties, a switching time may increase.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a radio frequency switching device includes a switching circuit including a first transistor and a second transistor stacked between a first terminal and a second terminal; a gate resistor circuit including a first gate resistor and a second gate resistor, a first end of the first gate resistor being connected to a gate of the first transistor and a first end of the second gate resistor being connected to a gate of the second transistor; a gate buffer circuit including a first gate buffer and a second gate buffer, the first gate buffer being connected to a second end of the first gate resistor and configured to provide a first gate signal to the gate of the first transistor through the first gate resistor, the second gate buffer being connected to a second end of the second gate resistor and configured to provide a second gate signal to the gate of the second transistor through the second gate resistor; and a delay circuit configured to generate the first gate signal having a first switching time and to generate the second gate signal having a second switching time different than the first switching time, based on a received gate signal.

The first switching time may be an off-time in which the first gate signal transitions from an on-level to an off-level and the second switching time may be an off-time in which the second gate signal transitions from an on-level to an off-level, and the delay circuit may be configured to delay the off-time of the first gate signal by a first delay time, and to delay the off-time of the second gate signal by a second delay time, and the first delay time may be different from the second delay time.

The delay circuit may include a first delay device configured to delay the off-time of the first gate signal by the first delay time, and a second delay device configured to delay the off-time of the second gate signal by the second delay time.

The first delay device may include a first inverter configured to delay an off-time of a first input gate signal, and the second delay device may include a second inverter configured to delay an off-time of a second input gate signal.

The first delay device may include a first variable capacitor circuit connected to an input stage or an output stage of the first inverter, and configured to adjust the delay time of the first input gate signal by varying capacitance in response to a control signal, and the second delay device may include a second variable capacitor circuit connected to an input stage or an output stage of the second inverter, and configured to adjust the delay time of the second input gate signal by varying capacitance in response to the control signal.

One of the first gate buffer and the second gate buffer may include a first buffer configured to receive the first gate signal and a second buffer connected to the first buffer in parallel and configured to receive the first gate signal.

One of the first gate resistor and the second gate resistor may include a first resistor connected to an output stage of the first buffer and a second resistor connected to an output stage of the second buffer.

One of the first transistor and the second transistor may include a first switching transistor including a gate configured to receive the first gate signal from the first buffer and a second switching transistor including a gate configured to receive the first gate signal from the second buffer, a source connected to a source of the first switching transistor, a gate connected to the gate of the first switching transistor, and a body connected to a body of the first switching transistor.

In another general aspect, a radio frequency switching device includes a first radio frequency switching circuit connected between a first terminal and a second terminal, and switching a first signal path for a first signal; and a second radio frequency switching circuit connected between the first terminal and a third terminal, and switching a second signal path for a second signal. The first radio frequency switching circuit includes a switching circuit including a first transistor and a second transistor stacked between a first terminal and a second terminal; a gate resistor circuit including a first gate resistor and a second gate resistor, a first end of the first gate resistor being connected to a gate of the first transistor and a first end of the second gate resistor being connected to a gate of the second transistor; a gate buffer circuit including a first gate buffer and a second gate buffer, the first gate buffer being connected to a second end of the first gate resistor and configured to provide a first gate signal to the gate of the first transistor through the first gate resistor, the second gate buffer being connected to a second end of the second gate resistor and configured to provide a second gate signal to the gate of the second transistor through the second gate resistor; and a delay circuit configured to generate the first gate signal having a first switching time and to generate the second gate signal having a second switching time different than the first switching time, based on a received gate signal.

The first switching time may be an off-time in which the first gate signal transitions from an on-level to an off-level and the second switching time may be an off-time in which the second gate signal transitions from an on-level to an off-level, and the delay circuit may be configured to delay the off-time of the first gate signal by a first delay time, and to delay the off-time of the second gate signal by a second delay time, and the first delay time may be different from the second delay time.

The delay circuit may include a first delay device configured to delay the off-time of the first gate signal by the first delay time, and a second delay device configured to delay the off-time of the second gate signal by the second delay time.

The first delay device may include a first inverter configured to delay an off-time of a first input gate signal, and the second delay device may include a second inverter configured to delay an off-time of a second input gate signal.

The first delay device may include a first variable capacitor circuit connected to an input stage or an output stage of the first inverter, and configured to adjust the delay time of the first input gate signal by varying capacitance in response to a control signal, and the second delay device may include a second variable capacitor circuit connected to an input stage or an output stage of the second inverter, and configured to adjust the delay time of the second input gate signal by varying capacitance in response to the control signal.

One of the first gate buffer and the second gate buffer may include a first buffer configured to receive the first gate signal and a second buffer connected to the first buffer in parallel and configured to receive the first gate signal.

One of the first gate resistor and the second gate resistor may include a first resistor connected to an output stage of the first buffer and a second resistor connected to an output stage of the second buffer.

One of the first transistor and the second transistor may include a first switching transistor including a gate configured to receive the first gate signal from the first buffer and a second switching transistor including a gate configured to receive the first gate signal from the second buffer, a source connected to a source of the first switching transistor, a gate connected to the gate of the first switching transistor, and a body connected to a body of the first switching transistor.

In another general aspect, a radio frequency switching device includes a delay circuit configured to receive an input gate signal, to generate a first delayed output gate signal by delaying an off-time or an on-time of the input gate signal by a first time, and to generate a second delayed output gate signal by delaying an off-time or an on-time of the input gate signal by a second time that is different from the first time; and a switching circuit disposed between two terminals and configured to receive the first delayed output gate signal and the second delayed output gate signal.

A voltage difference between an on-level voltage and an off-level voltage of the first delayed output gate signal may be different than a voltage difference between an on-level voltage and an off-level voltage of the second delayed output gate signal.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
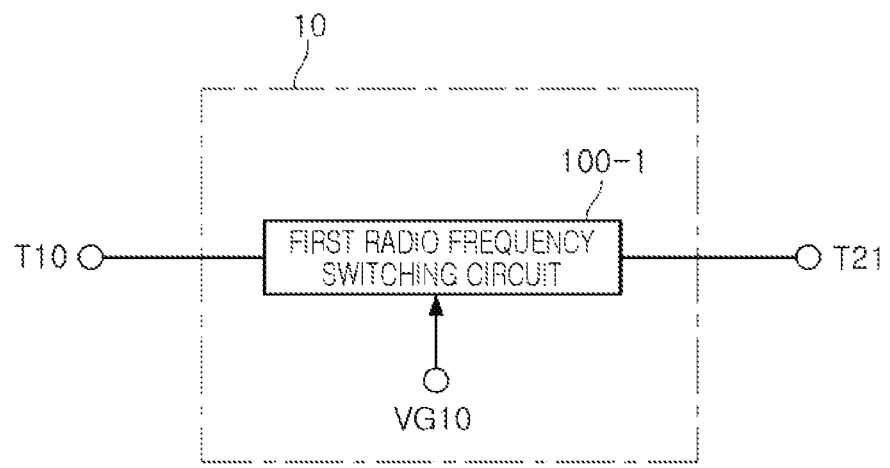
FIG. 1 is a diagram illustrating a radio frequency switching device according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is a diagram illustrating a radio frequency switching device according to an example.

Referring to FIG. 1, a radio frequency switching device 10 may include at least one first radio frequency switching circuit 100-1.

The first radio frequency switching circuit 100-1 may be connected between a first terminal T10 and a second terminal T21, and may switch on or switch off a first signal path between the first terminal T10 and the second terminal T21.

Figure 2:
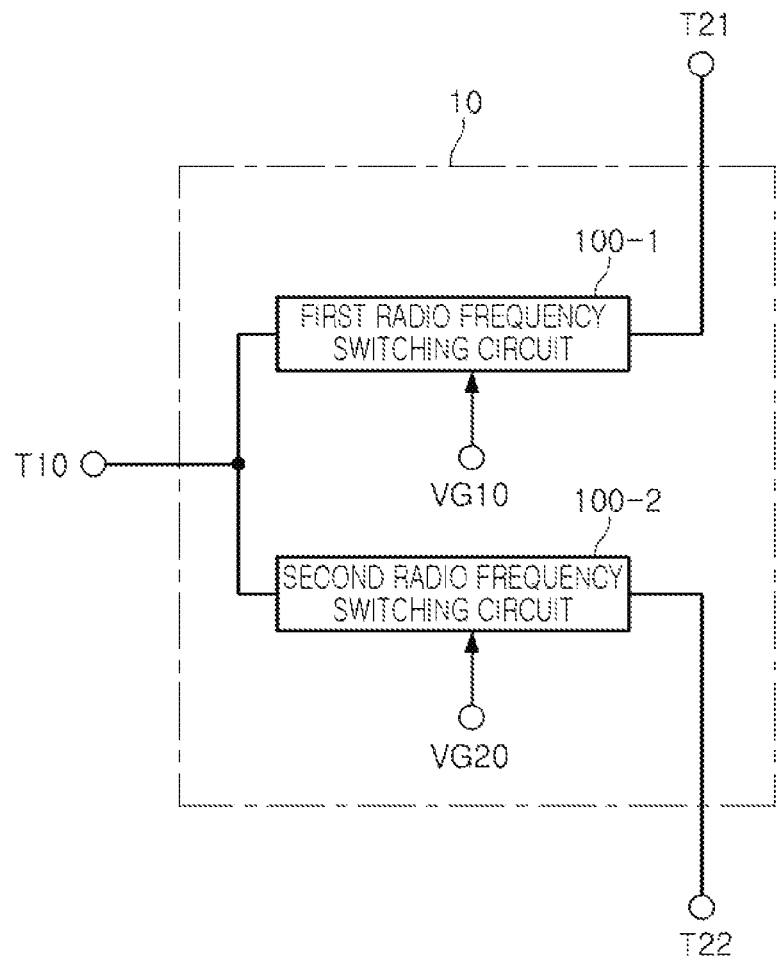
FIG. 2 is a diagram illustrating a radio frequency switching device according to an example.

FIG. 2 is a diagram illustrating a radio frequency switching device according to an example.

Referring to FIG. 2, a radio frequency switching device 100 may include a first radio frequency switching circuit 100-1 and a second radio frequency switching circuit 100-2.

The first radio frequency switching circuit 100-1 may be connected between a first terminal T10 and a second terminal T21, and may switch on or switch off a first signal path between the first terminal T10 and the second terminal T21 in response to a first gate signal VG10 to transfer and block a first signal.

The second radio frequency switching circuit 100-2 may be connected between the first terminal T10 and a third terminal T22, and switch on or switch off a second signal path between the first terminal T10 and the third terminal T22 in response to a second gate signal VG20 to transfer and block a first signal.

Referring to FIGS. 1 and 2, the first radio frequency switching circuit 100-1 and the second radio frequency switching circuit 100-2 may have the same circuit structure. For example, the first radio frequency switching circuit 100-1 and the second radio frequency switching circuit 100-2 may have a circuit structure as illustrated in FIG. 3.

For instance, each of the first radio frequency switching circuit 100-1 and the second radio frequency switching circuit 100-2 may include a series switch and a shunt switch.

In the description below, a radio frequency switching circuit 100 will be described in greater detail as an example of the first radio frequency switching circuit 100-1 and the second radio frequency switching circuit 100-2.

Figure 3:
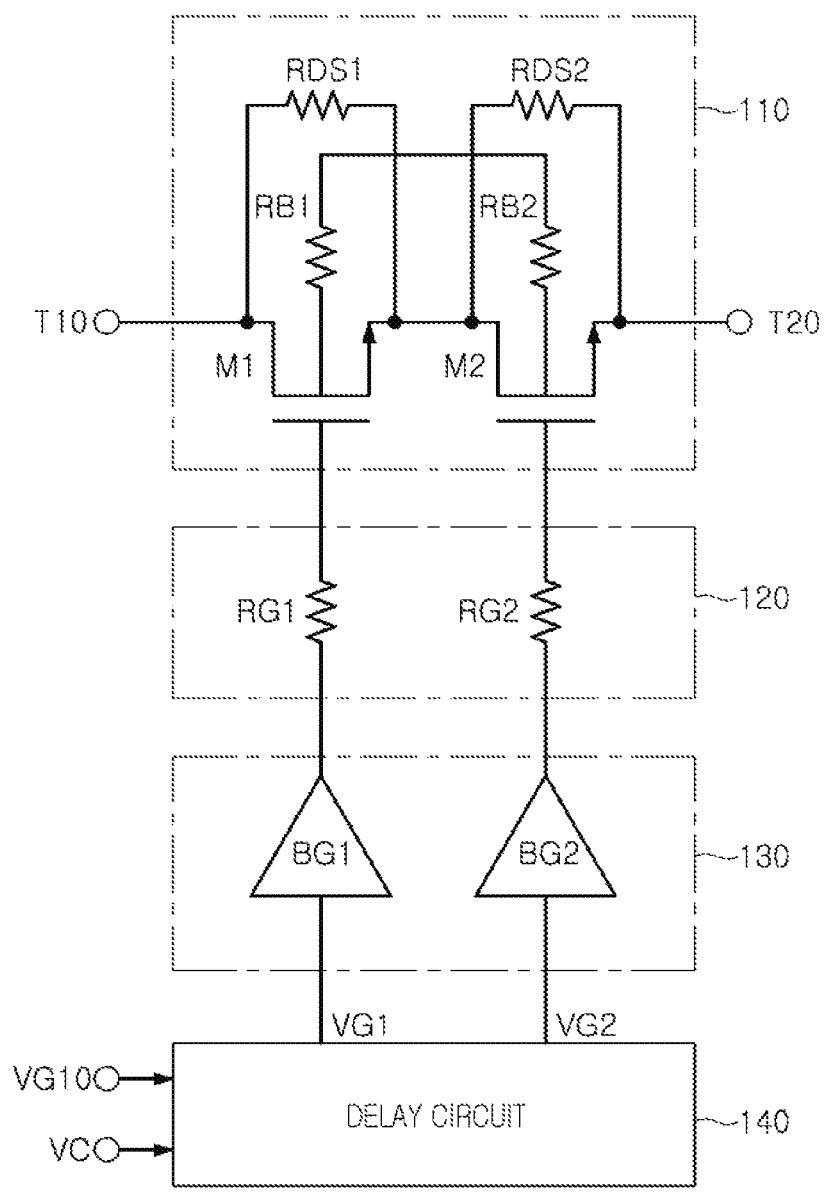
FIG. 3 is a diagram illustrating a radio frequency switching device according to an example.

FIG. 3 is a diagram illustrating a radio frequency switching circuit according to an example.

Referring to FIG. 3, a radio frequency switching circuit 100 may include a switching circuit 110, a gate resistor circuit 120, a gate buffer circuit 130, and a delay circuit 140.

Figure 4:
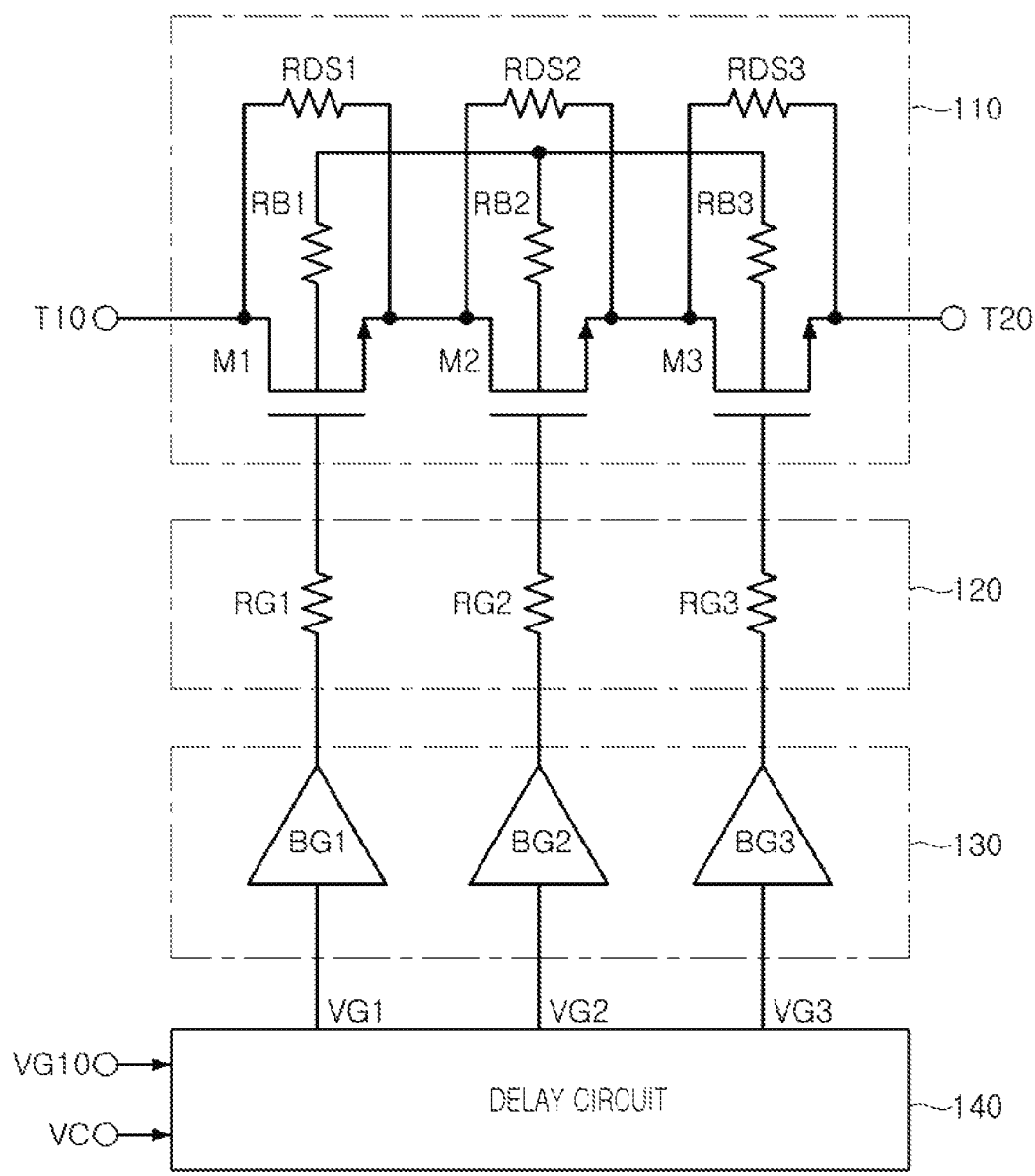
FIG. 4 is a diagram illustrating a radio frequency switching device according to an example.

FIG. 4 is a diagram illustrating a radio frequency switching circuit according to an example.

Referring to FIG. 4, a radio frequency switching circuit 100 may include a switching circuit 110, a gate resistor circuit 120, a gate buffer circuit 130, and a delay circuit 140.

Referring to FIGS. 3 and 4, the switching circuit 110 may include a plurality of transistors (two or more) stacked between a first terminal T10 and a second terminal T21.

The gate resistor circuit 120 may include a plurality of gate resistors (two or more) having one ends respectively connected to gates of the plurality of transistors.

The gate buffer circuit 130 may respectively be connected to the other ends of the plurality of gate resistors and may include a plurality of gate buffers (two or more) providing a plurality of gate signals to the gates of the plurality of transistors through the plurality of gate resistors.

The delay circuit 140 may generate the plurality of gate signals having different switching times by delaying the switching times differently, based on a received gate signal VG10.

The switching time may be an off-time in which the signal transitions from an on-level to an off-level, based on the received gate signal VG10, or may be an on-time in which the signal transitions from an off-level to an on-level, based on the received gate signal VG10.

The examples of the switching circuit 110, the gate resistor circuit 120, the gate buffer circuit 130, and the delay circuit 140 are described with reference to FIGS. 3 and 4, but the configurations thereof are not limited thereto.

Referring to FIG. 3, the switching circuit 110 may include first and second transistors M1 and M2 stacked between the first terminal T10 and the second terminal T21.

The gate resistor circuit 120 may include first and second gate resistors RG1 and RG2 having one ends respectively connected to gates of the first and second transistors M1 and M2.

The gate buffer circuit 130 may include first and second gate buffers BG1 and BG2 respectively connected to the other ends of the first and second gate resistors RG1 and RG2, and providing first and second gate signals VG1 and VG2 to gates of the first and second transistors M1 and M2 through the first and second gate resistors RG1 and RG2.

The delay circuit 140 may generate the first and second gate signals VG1 and VG2 having different switching times by delaying the switching times differently, based on a received gate signal VG10. For example, the switching time may be an off-time in which the signal transitions from an on-level to an off-level.

Referring to FIG. 4, a switching circuit 110 may include first, second, and third transistors M1, M2, and M3 stacked between a first terminal T10 and a second terminal T21.

A gate resistor circuit 120 may include first, second, and third gate resistors RG1, RG2, and RG3 having one ends respectively connected to gates of the first, second, and third transistors M1, M2, and M3.

A gate buffer circuit 130 may include first, second, and third gate buffers BG1, BG2, and BG3 respectively connected to the other ends of the first, second, and third gate resistors RG1, RG2, and RG3, and providing first, second, and third gate signals VG1, VG2, and VG3 to the gates of the first, second, and third transistors M1, M2, and M3 through the first, second, and third gate resistors RG1, RG2, and RG3.

A delay circuit 140 may generate the first, second, and third gate signals VG1, VG2, and VG3, at least one of which has a switching time different from switching times of the other gate signals by delaying at least one switching time to be different from the other switching times, based on a received gate signal VG10. The switching time may be, for example, an off-time in which the signal transitions from an on-level to an off-level.

Instead of providing common gate signals having the same switching time to the plurality of transistors, individual gate signals, independent of one another, may respectively be provided to the plurality of transistors through the gate resistors and the gate buffers, and at least one of the gate signals may have a switching time different from switching times of the other gate signals. Accordingly, only a single transistor may be present in a single buffer, and a switching time may be determined based on a value of the gate resistor of the single transistor and capacitance while preventing a degradation of isolation properties, thereby improving a switching time.

In a radio frequency switch illustrated in FIG. 3, sizes of the first and second transistors M1 and M2 may be relatively smaller than sizes of general transistors using a common gate signal, as sizes of independently provided gate signals are relatively small. For example, a size of the transistor in the examples may be half the size of a general transistor.

Also, the first gate buffer BG1 and the second gate buffer BG2 may respectively receive a first gate signal VG1 and a second gate signal VG2, which are different from each other. For example, sizes of the first gate buffer BG1 and the second gate buffer BG2 may be relatively smaller than sizes of general common gate buffers which are connected in common to the plurality of transistors. Accordingly, a size of the gate buffer in the examples may be half the size of a general gate buffer.

Also, referring to FIG. 3, with regard to a switching speed of a radio frequency switching circuit, the switching speed may rely on a time constant (T) determined in accordance with a resistance value (R) of the first gate resistor RG1 or the second gate resistor RG2, and a capacitance (C) of the first transistor M1 and the second transistor M2. The first gate resistor RG1 or the second gate resistor RG2 may be an isolation resistor, and may thus be set to a relatively high resistance value (R).

In the radio frequency switching circuit in the examples, a gate buffer is disposed in each of the first transistor M1 and the second transistor M2, rather than using a single buffer in a general radio frequency switching circuit. Accordingly, a respective gate resistor and a respective transistor may be present in each of the first transistor M1 and the second transistor M2, each having only one buffer, and thus, a size of the gate signal may be reduced, and a size of the gate buffer may also be reduced.

Thus, without increasing an overall size of a radio frequency switching circuit, a switching speed may improve. As described above, when a radio frequency switching circuit is configured as in FIG. 3, isolation properties may not be degraded, and the switching time may be improved without increasing a size or an area. The configuration in FIG. 3 may be applied to FIG. 4 as well.

Figure 5:
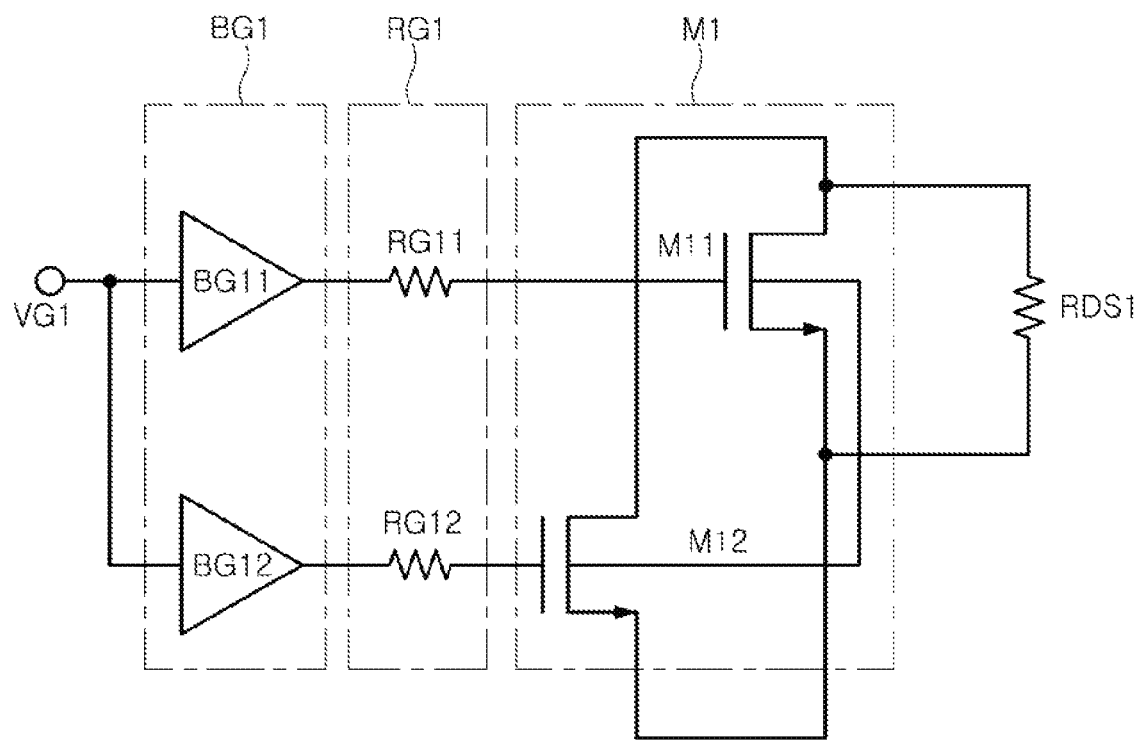
FIG. 5 is a diagram illustrating a first gate buffer, a first gate resistor, and a first transistor of a radio frequency switching circuit according to an example.

A radio frequency switching circuit may also be configured as in FIG. 5 to obtain an improved switching time.

FIG. 5 is a diagram illustrating a first gate buffer, a first gate resistor, and a first transistor of a radio frequency switching circuit according to an example.

Referring to FIG. 5, a first gate buffer BG1 may include a first buffer BG11 and a second buffer BG12. The first buffer BG11 may receive a first gate signal VG1. The second buffer BG12 may be connected to the first buffer BG11 in series and receive the first gate signal VG1, as in the first buffer BG11.

The first gate resistor RG1 may include a first resistor RG11 and a second resistor RG12. The first resistor RG11 may be connected to an output stage of the first buffer BG11, and the second resistor RG12 may be connected to an output stage of the second buffer BG12.

The first transistor M1 may include a first switching transistor M11 and a second switching transistor M12.

The first switching transistor M11 may include a gate which receives the first gate signal VG1 from the first buffer BG11.

The second switching transistor M12 may include a gate receiving the first gate signal VG1 from the second buffer BG12, a source connected to a source of the first switching transistor M11, a gate connected to a gate of the first switching transistor M11, and a body connected to a body of the first switching transistor M11.

Referring to FIG. 5, for example, a value of the gate resistor connected to the gate may be configured to be the same as in a general radio frequency switching circuit such that sufficient isolation may be secured, and gate capacitance may be reduced by half, thereby further reducing the switching time.

Figure 6A:
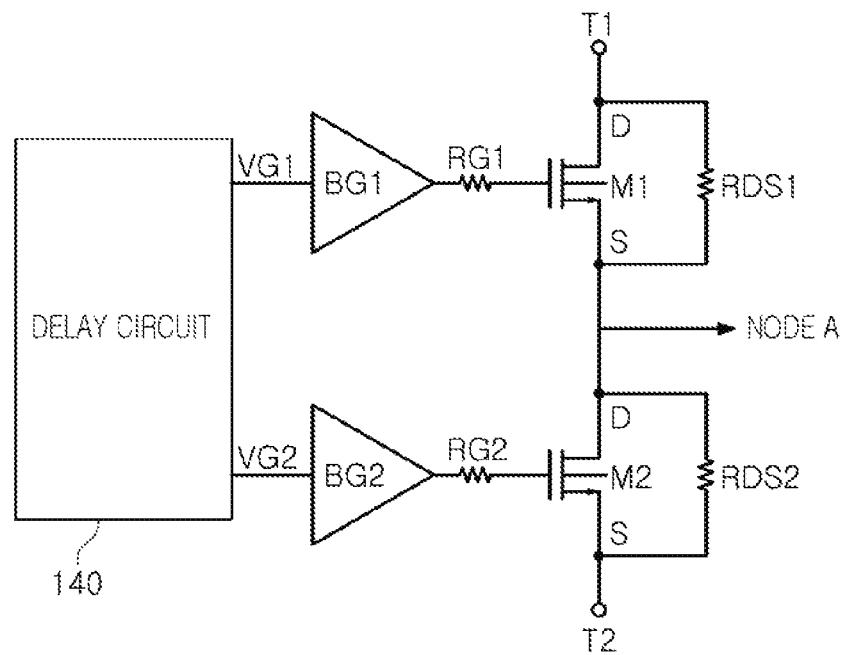
FIG. 6A is a circuit diagram illustrating a portion of a radio frequency switching circuit illustrated in FIG. 3.
Figure 6B:
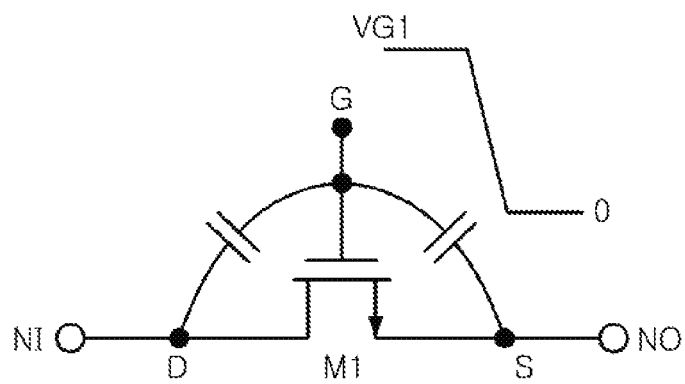
FIG. 6B is a diagram illustrating a clock feed through using a first transistor illustrated in FIG. 4.
Figure 7:
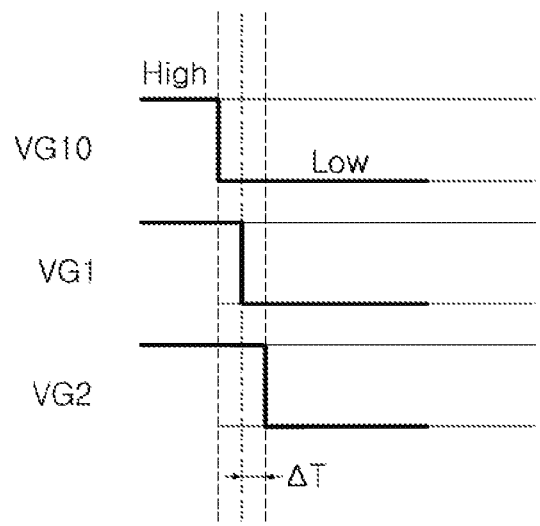
FIG. 7 is a diagram illustrating a gate signal of a radio frequency switching circuit illustrated in FIG. 6A.

FIG. 6A is a circuit diagram illustrating a portion of a radio frequency switching circuit illustrated in FIG. 3. FIG. 6B is a diagram illustrating a clock feed through using a first transistor illustrated in FIG. 4. FIG. 7 is a diagram illustrating a gate signal of a radio frequency switching circuit illustrated in FIG. 6A.

Referring to FIG. 6A, in a radio frequency switching circuit, in the case in which first and second transistors M1 and M2 are controlled by a single gate signal, high impedance may occur in node A between the first and second transistors M1 and M2 when the gate signal transitions from a high level to a low level, and a low value of the gate signal may appear in the node A by a clock feed through. To prevent this, drain-source resistors RDS1 and RDS2 may be necessary.

Values of the drain-source resistors RDS1 and RDS2 may need to be sufficiently high to prevent degradation of insertion loss, and may also need to be sufficiently low to prevent degradation of a switching time. The insertion loss may be sufficiently reduced using the sufficiently high drain-source resistors RDS1 and RDS2, and a radio frequency switching circuit may be implemented as illustrated in FIGS. 3 to 6, thereby improving a switching time.

By configuring switching times (an off-time or an on-time) of a plurality of gate signals to be different from each other using a delay circuit 140, high impedance may be prevented in a connection node between switching devices, and the impacts of the clock feed through may be reduced. The configuration above will be described in greater detail with reference to FIG. 6B.

Referring to FIG. 4, FIG. 6B illustrates a first transistor M1 among the stacked first, second, and third transistors M1, M2, and M3 in FIG. 4. When "NI" is an input node of the first transistor M1, "NO" may be an output node of the first transistor M1, and may be connected to an input node of the second transistor M2. For example, when the first, second, and third transistors M1, M2, and M3 are stacked, the first and third transistors M1 and M3 at both ends may be connected to 50Ω source or a load resistor and may have relatively low impedance, but the second transistor M2 in the middle may have relatively high impedance as off-resistors of the transistors M1 and M3 at both ends are connected to the second transistor M2.

When the first transistor M1 illustrated in FIG. 6B is turned off, a gate voltage VG1 (e.g., a clock signal) of a gate may appear in an input node NI or an output node NO by a parasitic capacitance. In the case in which the input node NI or the output node NO are in low impedance, changes in voltage caused by a clock feed through may have a relatively low time constant (RC), and the transistors may enter a normal state more quickly by the relatively low time constant (RC).

However, as in the middle transistor (M2 in FIG. 4), in the case in which the transistors at both ends have high impedance of an off-transistor, the transistors at both ends may have a relatively high time constant (RC) and enter a normal state more slowly by the relatively high time constant (RC), and a relatively long time may be taken. Thus, the middle transistor M2 may be configured to be in an off-state earlier than the other transistors, and then the transistors at both ends M1 and M3 may be configured to be in an off-state later or to be sequentially in an off-state with a certain time interval, thereby reducing the impact of a clock feed through.

The clock feed through may be caused by a level transition in a gate voltage or in a clock signal. The clock feed through may refer to the phenomenon in which voltages of an input node and an output node decrease to a low level of a gate voltage when an off-voltage of a gate is applied, that is, when a level transitions from a high level to a low level, as illustrated in FIG. 6B.

In the description below, an example in which a first gate signal VG1 and a second gate signal VG2 are sequentially switched off with a time interval ΔT will be described with reference to FIGS. 6A, 6B, and 7.

The first gate signal VG1 may transition from a high level to a low level, and a first transistor M1 may enter an off-state. As the second gate signal VG2 is still at a high level, the second transistor M2 may maintain an on-state, and node A may maintain low impedance at the moment.

Accordingly, while the second gate signal VG2 maintains a high level, the first gate signal VG1 may transition to an off-level earlier than the second gate signal VG2, thereby reducing an impact of a clock feed through.

With regard to the time ΔT, if the time ΔT is set to be relatively short, such that the time ΔT does not affect a switching time, an overall switching time may not be significantly affected. For example, ΔT may be set to a several ps to a several ns, and the switching time may be set to several hundred ns.

A delay circuit 140 may be implemented as a logic, or may be implemented using a passive device. For example, delay times of the delay circuit 140 may be fixed to a predetermined value or may be varied. The delay circuit 140 may receive a control signal VC and vary delay times, and may generate respective gate signals of which the delay times are varied.

Figure 8:
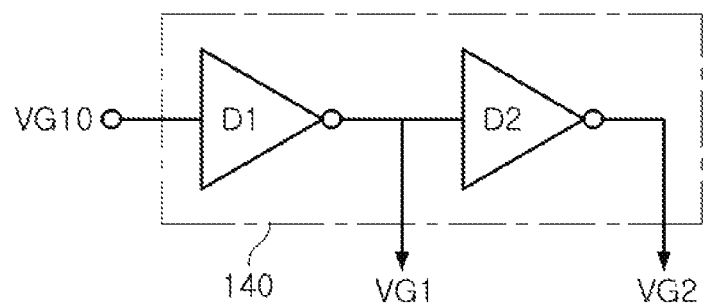
FIG. 8 is a diagram illustrating a delay circuit according to an example.

FIG. 8 is a diagram illustrating a delay circuit according to an example.

Referring to FIG. 8, a delay circuit 140 may include a first delay device D1 and a second delay device D2.

The first delay device D1 may delay an off-time of a first gate signal VG10 by a first delay time t1 and generate a first gate signal VG1. The second delay device D2 may delay an off-time of the first gate signal VG10 by a second delay time t2 and generate the second gate signal VG2. For example, a time difference between the first delay time t1 and the second delay time t2 may be ΔT.

Figure 9:
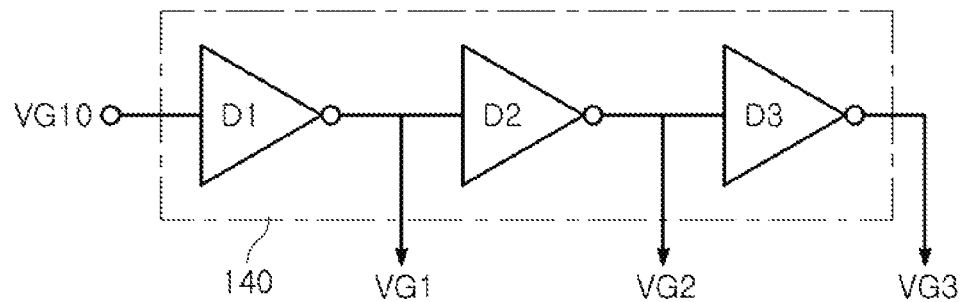
FIG. 9 is a diagram illustrating a delay circuit according to an example.

FIG. 9 is a diagram illustrating a delay circuit according to an example.

A delay circuit 140 may include a first delay device D1, a second delay device D2, and a third delay device D3.

The first delay device D1 may delay an off-time of a first gate signal VG10 by a first delay time t1 and generate a first gate signal VG1. The second delay device D2 may delay an off-time of the first gate signal VG10 by a second delay time t2 and generate the second gate signal VG2. The third delay device D3 may delay an off-time of the first gate signal VG10 by a third delay time t3 and generate a third gate signal VG3.

For example, each of the first delay device D1, the second delay device D2, and the third delay device D3 may include at least one inverter, a delay device, and may further include a variable capacitor device. The example having the configuration above will be described with reference to FIGS. 10, 11, and 12, but the disclosure is not limited to such configurations.

Figure 10:
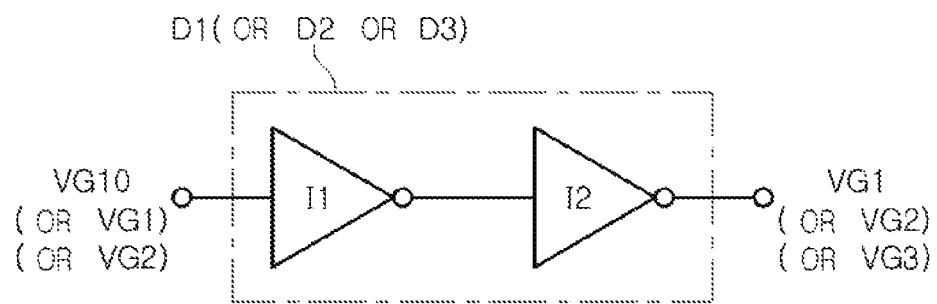
FIG. 10 is a diagram illustrating a delay device according to an example.

FIG. 10 is a diagram illustrating a delay device according to an example.

Referring to FIG. 10, a first delay device D1, a second delay device D2, or a third delay device D3 may include first and second inverters I1 and I2. The first and second inverters I1 and I2 may delay an off-time of an input gate signal. For example, the first and second inverters I1 and I2 may delay an input signal by a predetermined delay time and output the signal.

Figure 11:
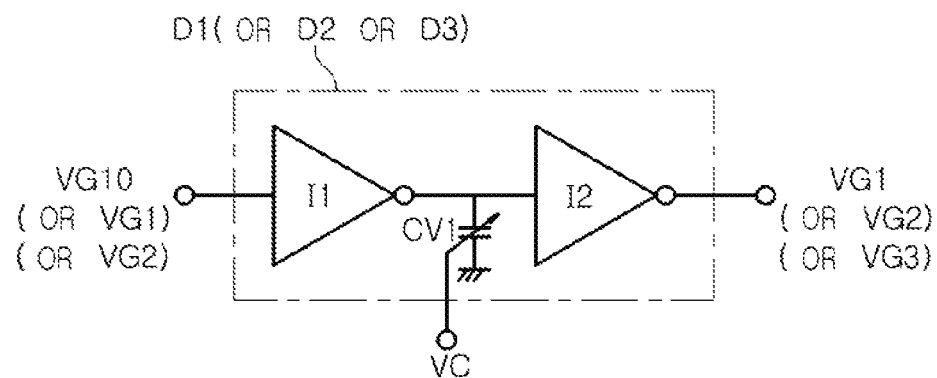
FIG. 11 is a diagram illustrating a delay device according to an example.

FIG. 11 is a diagram illustrating a delay device according to an example.

Referring to FIG. 11, a first delay device D1, a second delay device D2, or a third delay device D3 may include first and second inverters I1 and I2 and a variable capacitor circuit CV1.

The first and second inverters I1 and I2 may delay an off-time of an input gate signal. The variable capacitor circuit CV1 may be connected between an input stage or an output stage of the first and second inverters I1 and I2, may adjust a delay time by varying capacitance in response to a control signal VC.

embodiment configuration of the delay device may not be limited to the examples in FIGS. 10 and 11. Any circuit or device capable of delaying a switching time may be employed as the delay device.

Figure 12:
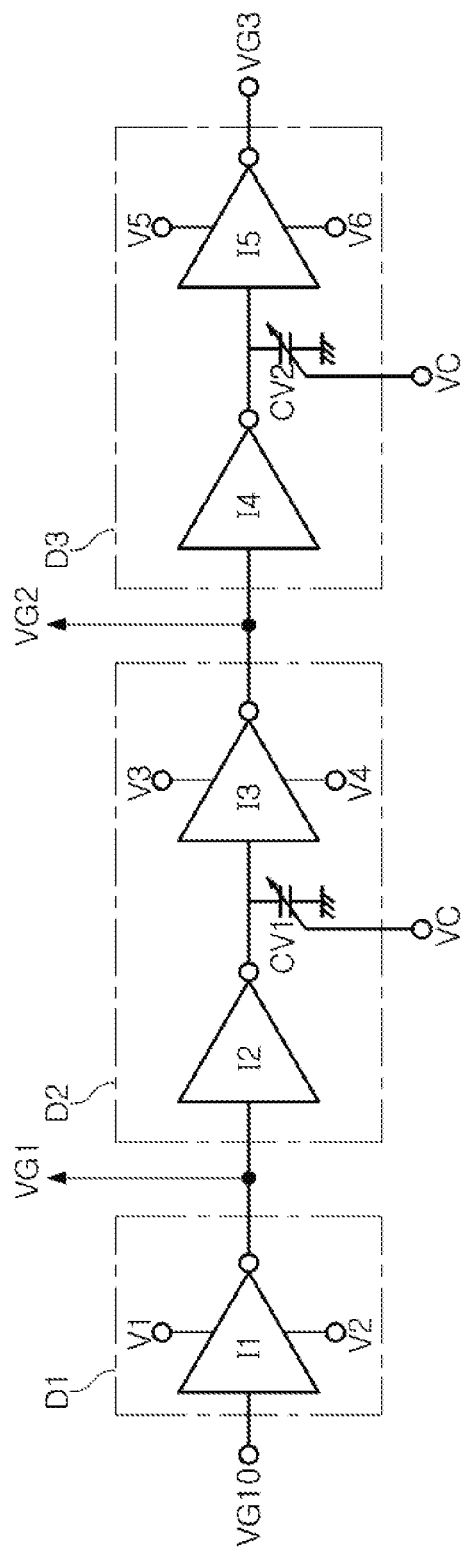
FIG. 12 is a diagram illustrating an example of a delay circuit illustrated in FIG. 9.

FIG. 12 is a diagram illustrating an example of a delay circuit in FIG. 9.

Referring to FIGS. 9 and 12, a delay circuit 140 may include a first delay device D1, a second delay device D2, and a third delay device D3.

As an example, the first delay device D1 may include a first inverter I1, the second delay device D2 may include a second inverter I2, a first variable capacitor circuit CV1, and a third inverter I3, the third delay device D3 may include a fourth inverter I4, a second variable capacitor circuit CV2, and a fifth inverter I5.

Referring to FIG. 12, an on-level voltage and an off-level voltage of a first gate signal VG1 may be determined in accordance with a first voltage V1 and a second voltage V2, an on-level voltage and an off-level voltage of a second gate signal VG2 may be determined in accordance with a third voltage V3 and a fourth voltage V4, an on-level voltage and an off-level voltage of a third gate signal VG3 may be determined in accordance with a fifth voltage V5 and a sixth voltage V6. For example, V1, V3, and V5 may be VDD voltages, and V2, V4, and V6 may be VSS voltages.

An impact of a clock feed through may be mainly caused by a transistor lastly entering an on-state among a plurality of stacked transistors. Thus, levels of V1 to V6 may be set differently in accordance with an order of the transistors entering an off-state. For example, V3 and V4 may be set to be lower than V1 and V2 by 0.2V, and V5 and V6 may be set to be lower than V3 and V4.

Figure 13:
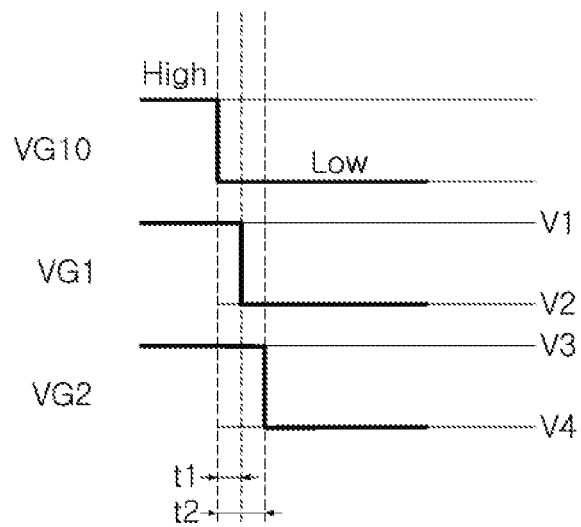
FIG. 13 is a diagram illustrating a gate signal according to an example.

FIG. 13 is a diagram illustrating a gate signal according to an example.

Referring to FIGS. 8 and 13, a delay circuit 140 may delay an off-time of a first gate signal VG10 by a first delay time t1 and generate a first gate signal VG1, and may delay an off-time of the first gate signal VG10 by a second delay time t2 and generate a second gate signal VG2.

For example, the first delay time t1 may be different from the second delay time t2.

Figure 14:
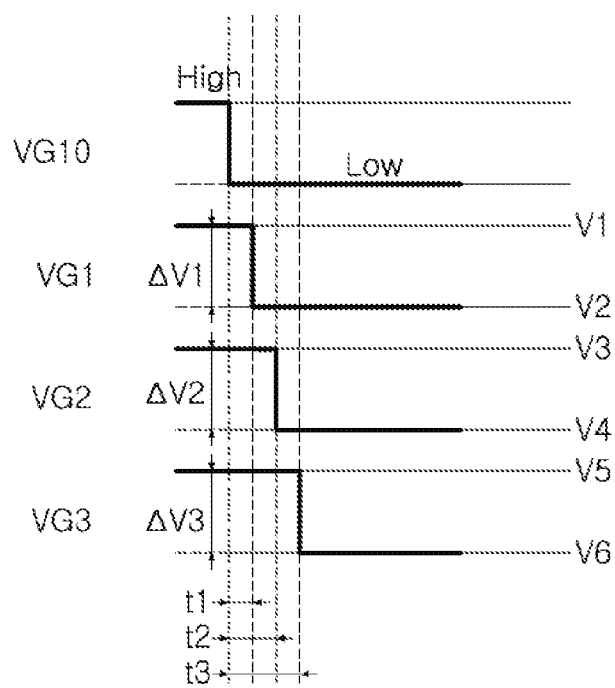
FIG. 14 is a diagram illustrating a gate signal according to an example.
Figure 15:
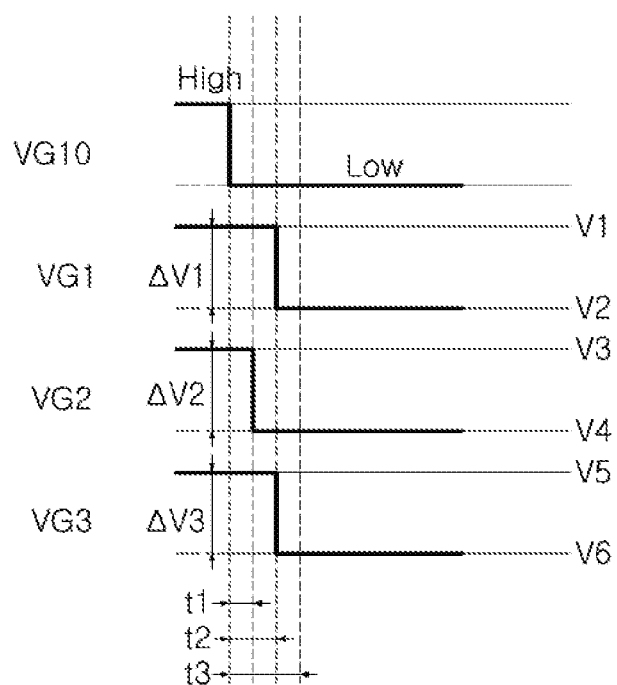
FIG. 15 is a diagram illustrating a gate signal according to an example.

FIG. 14 is a diagram illustrating a gate signal according to an example. FIG. 15 is a diagram illustrating a gate signal according to an example.

Referring to FIGS. 13, 14, and 15, one of a plurality of switches may be turned off earlier than the switches.

Referring to FIGS. 9 and 14, an order of an off-time may be a first gate signal VG1, a second gate signal VG2, and a third gate signal VG3, for example. As an example, a delay circuit 140 may delay an off-time of a first gate signal VG10 by a first delay time t1 and generate the first gate signal VG1, may delay an off-time of the first gate signal VG10 by a second delay time t2 and generate the second gate signal VG2, and delay an off-time of the first gate signal VG10 by a third delay time t3 and generate a third delay time t3.

Referring to FIGS. 9 and 15, an order of an off-time may be a first gate signal VG1, a second gate signal VG2, and a third gate signal VG3, for example. As an example, a delay circuit 140 may delay an off-time of a first gate signal VG10 by a first delay time t1 and generate a second gate signal VG2, may delay an off-time of the first gate signal VG10 by a second delay time t2 and generate a first gate signal VG1, and may delay an off-time of the first gate signal VG10 by a third delay time t3 and generate a third gate signal VG3.

Referring to FIGS. 14 and 15, with regard to a voltage difference between an on-level voltage and an off-level voltage of each of the gate signals, at least one of ΔV1, ΔV2, and ΔV3 may be different from the others. For example, ΔV (an on-level voltage−an off-level voltage) of a first turned off transistor may be lower than ΔV of a transistor turned off thereafter.

Figure 16:
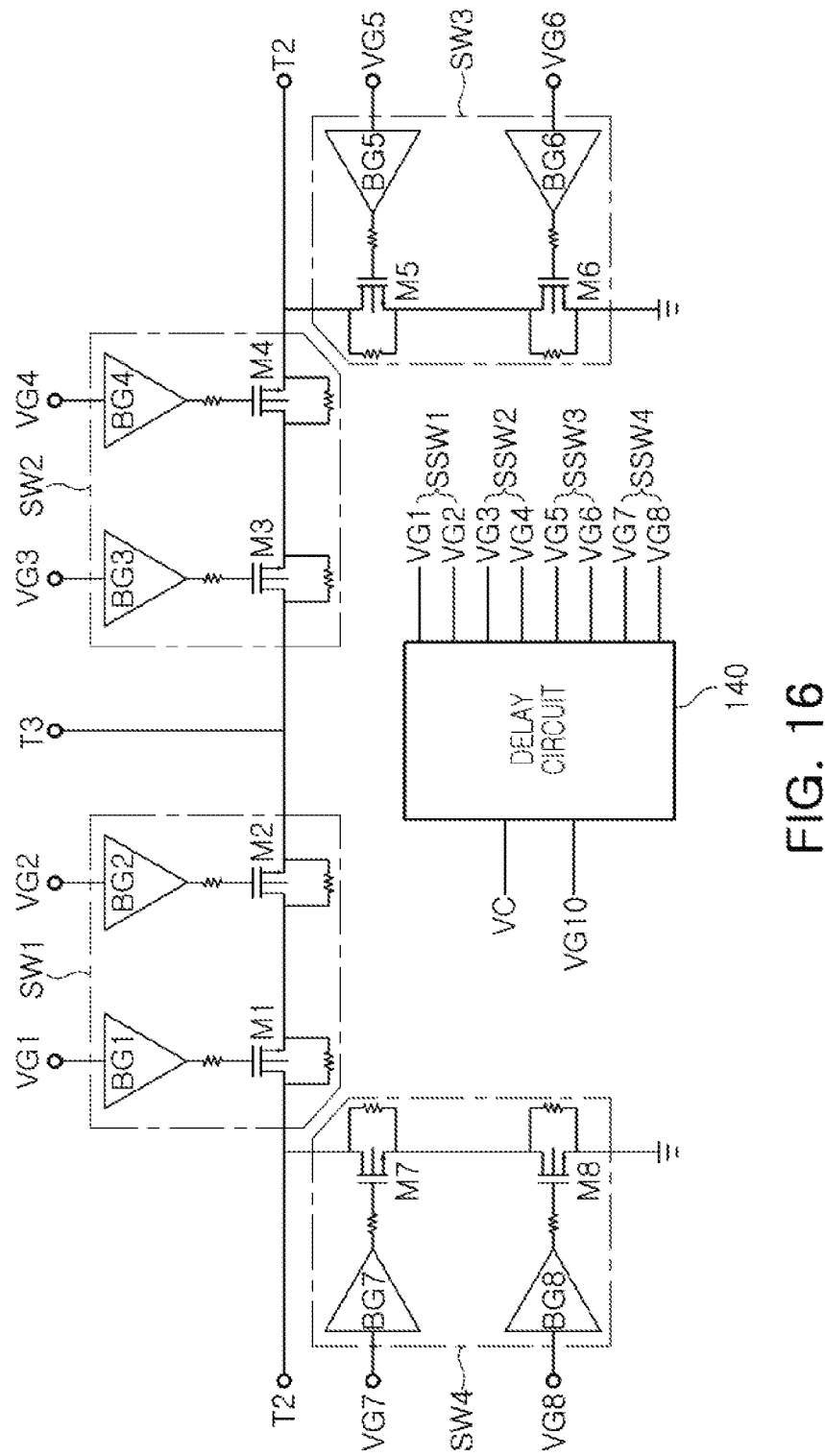
FIG. 16 is a diagram illustrating an SPDT switch in which a radio frequency switching circuit is applied according to an example.
Figure 17:
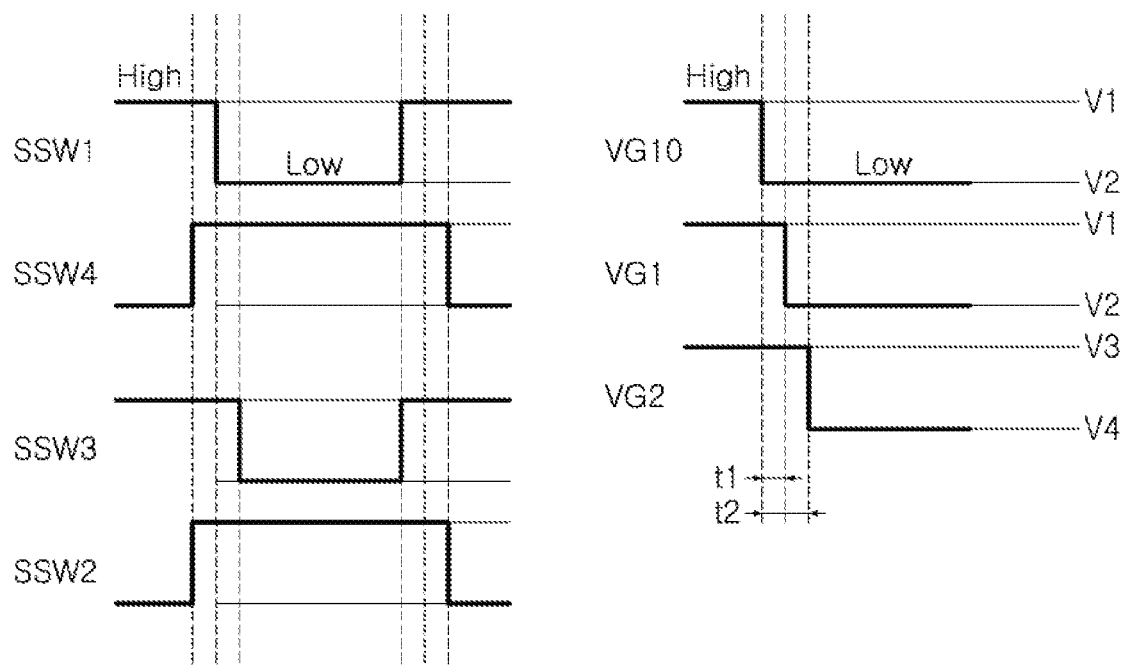
FIG. 17 is a diagram illustrating a switching timing of an SPDT switch illustrated in FIG. 15.

FIG. 16 is a diagram illustrating a single pole double throw (SPDT) switch in which a radio frequency switching circuit is applied according to an example. FIG. 17 is a diagram illustrating a switching timing of an SPDT switch in FIG. 15.

An SPDT switch illustrated in FIG. 16 may include a first series switch group SW1 including first and second transistors M1 and M2, a second series switch group SW2 including third and fourth transistors M3, and M4, a first shunt switch group SW3 including fifth and sixth transistors M5 and M6, and a second shunt switch group SW3 including seventh and eighth transistors M7 and M8.

Gate signals VG1 to VG8 respectively provided to the plurality of switch groups may be determined to have off-times delayed by a predetermined delay time, based on a gate signal VG10.

Referring to FIGS. 16 and 17, the first to fourth switch groups SW1 to SW4 may respectively be controlled by first to fourth switch group signals SSW1 to SSW4. The first switch group signal SSW1 may include first and second gate signals VG1 and VG2, the second first switch group signal SSW2 may include third and fourth gate signals VG3 and VG4, the third switch group signal SSW3 may include fifth and sixth gate signals VG5 and VG6, and the fourth switch group signal SSW4 may include seventh and eighth gate signals VG7 and VG8. For example, each of the first to fourth switch groups SW1 to SW4 may include two gate signals, and the two gate signals may have a certain delay time ΔT and a certain voltage difference ΔV.

For example, the first to fourth switch groups SW1 to SW4 may have an on-off order as discussed below to significantly reduce an impact of a clock feed through.

As an example, as illustrated in FIG. 17, before the first switch group signal SSW1 transitions to an off-level, the second and fourth switch group signals SSW2 and SSW4 may be in an on-level voltage, then the first switch group signal SSW1 may be in an off-level voltage, and the third switch group signal SSW3 may be in an off-level voltage.

An order of subsequent on-level transition may be, before the second switch group signal SSW2 is in an off-level voltage, the first and third switch group signals SSW1 and SSW3 may be in an on-level voltage, then the second switch group signal SSW2 may be in an off-level voltage, and the fourth switch group signal SSW4 may be in an off-level voltage.

Figure 18:
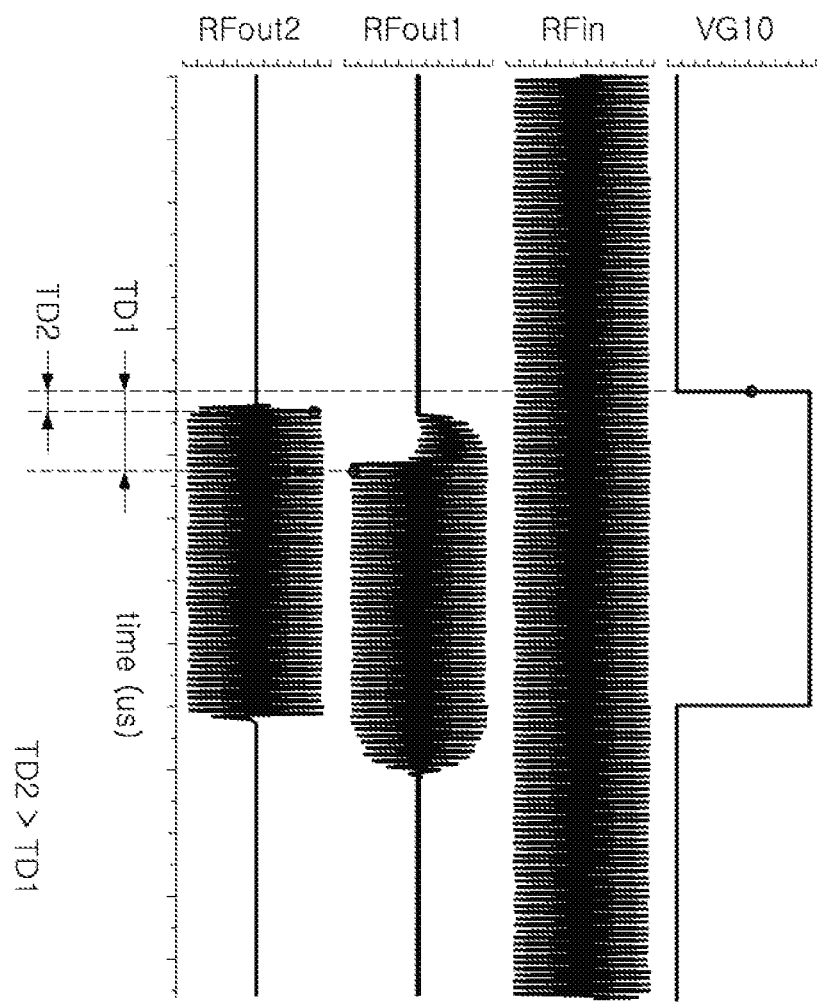
FIG. 18 is a diagram illustrating a result of simulation in relation to a delay time of a gate signal according to an example.

FIG. 18 is a diagram illustrating a result of simulation in relation to a delay time of a gate signal according to an example.

Referring to FIG. 18, "VG(V)" is a gate voltage, "RFin (V)" is a voltage of an input signal, "RFout1(V)" is a voltage of an output signal of a general switching circuit, "RFout2 (V)" is a voltage of an output signal of a switching circuit according to an example.

Figure 19:
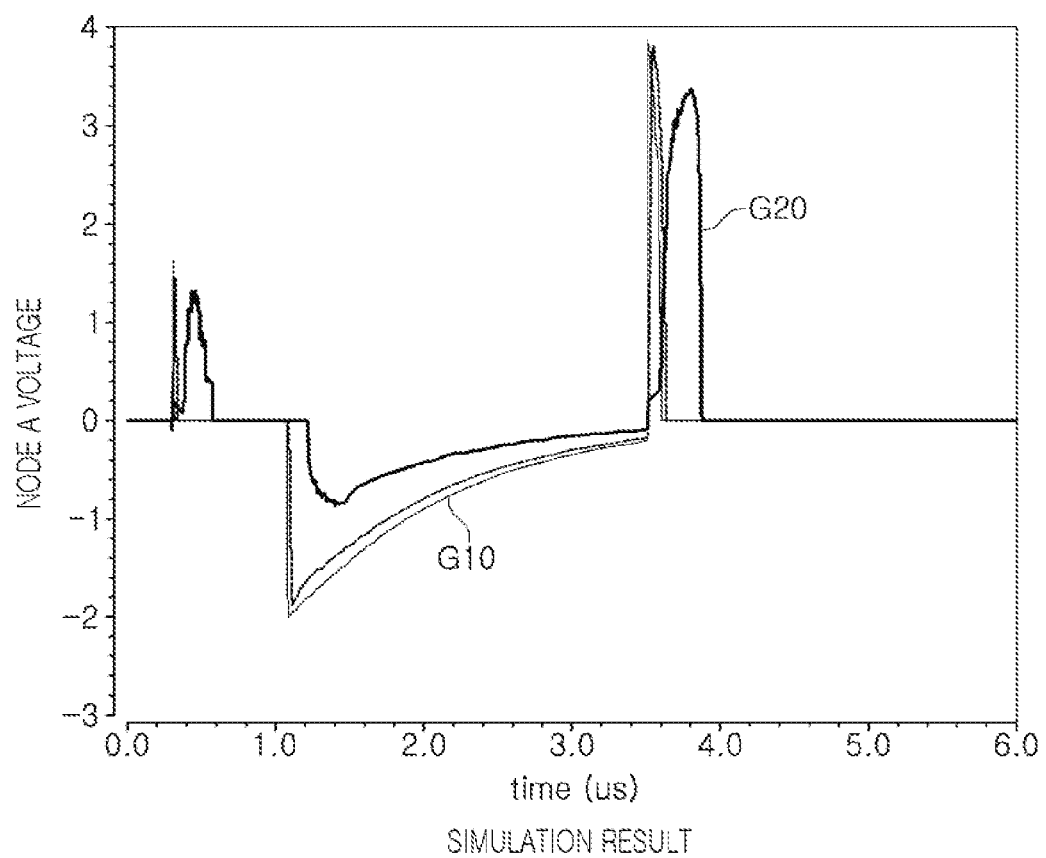
FIG. 19 is a graph illustrating an impact of a clock feed through depending on a presence of a delay cell.

When the RF output (RFout2(V)) is compared to the general RF output (RFout1(V)) with reference to the RFin (V) in FIGS. 18 and 19, a delay time TD2 (delayed by approximately 0.32 µsec) of a gate signal of a radio frequency switching circuit was shorter than a delay time TD1 (delayed by approximately 1.27 µsec) of a gate signal of a general radio frequency switching circuit, and accordingly, a delay in switching was reduced.

FIG. 19 is a graph illustrating an impact of a clock feed through depending on a presence of a delay cell.

Referring to FIG. 19, with regard to a voltage in node A (node A in FIG. 6A) between two switches, when a delay circuit was not applied, the impact was significant as indicated in graph G10, whereas, when a delay circuit was applied, the impact was decreased as indicated in graph G20.

According to the aforementioned examples, by setting the switching times (an off-time or an on-time) of a plurality of gate signals differently, using a delay circuit, sudden high impedance may be prevented in a connection node between switching devices, and the impact of a clock feed through may thus be reduced.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A radio frequency switching device, comprising:
   a switching circuit comprising a first transistor and a second transistor stacked between a first terminal and a second terminal;
   a gate resistor circuit comprising a first gate resistor and a second gate resistor, a first end of the first gate resistor being connected to a gate of the first transistor and a first end of the second gate resistor being connected to a gate of the second transistor;
   a gate buffer circuit comprising a first gate buffer and a second gate buffer, the first gate buffer being connected to a second end of the first gate resistor and configured to provide a first gate signal to the gate of the first transistor through the first gate resistor, the second gate buffer being connected to a second end of the second gate resistor and configured to provide a second gate signal to the gate of the second transistor through the second gate resistor; and
   a delay circuit configured to generate the first gate signal having a first switching time and to generate the second gate signal having a second switching time different than the first switching time, based on a received gate signal,
   wherein the first switching time is an off-time in which the first gate signal transitions from an on-level to an off-level and the second switching time is an off-time in which the second gate signal transitions from an on-level to an off-level, and
   wherein the delay circuit is configured to delay the off-time of the first gate signal by a first delay time, and to delay the off-time of the second gate signal by a second delay time, and the first delay time is different from the second delay time.

2. The radio frequency switching device of claim 1, wherein the delay circuit comprises:
   a first delay device configured to delay the off-time of the first gate signal by the first delay time; and
   a second delay device configured to delay the off-time of the second gate signal by the second delay time.

3. The radio frequency switching device of claim 2, wherein the first delay device comprises a first inverter configured to delay an off-time of a first input gate signal and the second delay device comprises a second inverter configured to delay an off-time of a second input gate signal.

4. The radio frequency switching device of claim 3, wherein
   the first delay device comprises a first variable capacitor circuit connected to an input stage or an output stage of the first inverter, and configured to adjust the delay time of the first input gate signal by varying capacitance in response to a control signal, and
   the second delay device comprises a second variable capacitor circuit connected to an input stage or an output stage of the second inverter, and configured to adjust the delay time of the second input gate signal by varying capacitance in response to the control signal.

5. The radio frequency switching device of claim 1, wherein one of the first gate buffer and the second gate buffer comprises:
   a first buffer configured to receive the first gate signal; and
   a second buffer connected to the first buffer in parallel and configured to receive the first gate signal.

6. The radio frequency switching device of claim 5, wherein one of the first gate resistor and the second gate resistor comprises:
   a first resistor connected to an output stage of the first buffer; and
   a second resistor connected to an output stage of the second buffer.

7. The radio frequency switching device of claim 6, wherein one of the first transistor and the second transistor comprises:
   a first switching transistor comprising a gate configured to receive the first gate signal from the first buffer; and
   a second switching transistor comprising a gate configured to receive the first gate signal from the second buffer, a source connected to a source of the first switching transistor, a gate connected to the gate of the first switching transistor, and a body connected to a body of the first switching transistor.

8. A radio frequency switching device, comprising:
   a first radio frequency switching circuit connected between a first terminal and a second terminal, and switching a first signal path for a first signal; and
   a second radio frequency switching circuit connected between the first terminal and a third terminal, and switching a second signal path for a second signal,
   wherein the first radio frequency switching circuit comprises:
      a switching circuit comprising first transistor and a second transistor stacked between the first terminal and the second terminal;
      a gate resistor circuit comprising a first gate resistor and a second gate resistor, a first end of the first gate resistor being connected to a gate of the first transistor and a first end of the second gate resistor being connected to a gate of the second transistor;
      a gate buffer circuit comprising a first gate buffer and a second gate buffer, the first gate buffer being connected to a second end of the first gate resistors and configured to provide a first gate signal to the gate of the first transistor through the first gate resistor, the second gate buffer being connected to a second end of the second gate resistor and configured to provide a second gate signal to the gate of the second transistor through the second gate resistor; and
      a delay circuit configured to generate the first gate signal having a first switching time and to generate the second gate signal having a second switching time different than the first switching time, based on a received gate signal,
   wherein the first switching time is an off-time in which the first gate signal transitions from an on-level to an off-level and the second switching time is an off-time in which the second gate signal transitions from an on-level to an off-level, and
   wherein the delay circuit is configured to delay the off-time of the first gate signal by a first delay time, and to delay the off-time of the second gate signal by a second delay time, and the first delay time is different from the second delay time.

9. The radio frequency switching device of claim 8, wherein the delay circuit comprises:
   a first delay device configured to delay the off-time of the first gate signal by the first delay time; and
   a second delay device configured to delay the off-time of the second gate signal by the second delay time.

10. The radio frequency switching device of claim 9, wherein the first delay device comprises a first inverter configured to delay an off-time of a first input gate signal and the second delay comprises a second inverter configured to delay an off-time of a second input gate signal.

11. The radio frequency switching device of claim 10, wherein
   the first delay device comprises a first variable capacitor circuit connected to an input stage or an output stage of the first inverter, and configured to adjust the delay time of the first input gate signal by varying capacitance in response to a control signal, and
   the second delay device comprises a second variable capacitor circuit connected to an input stage or an output stage of the second inverter, and configured to adjust the delay time of the second input gate signal by varying capacitance in response to the control signal.

12. The radio frequency switching device of claim 8, wherein one of the first gate buffer and the second gate buffer comprises:
   a first buffer configured to receive the first gate signal; and
   a second buffer connected to the first buffer in parallel and configured to receive the first gate signal.

13. The radio frequency switching device of claim 12, wherein one of the first gate resistor and the second gate resistor comprises:
   a first resistor connected to an output stage of the first buffer; and
   a second resistor connected to an output stage of the second buffer.

14. The radio frequency switching device of claim 13, wherein one of the first transistor and the second transistor comprises:
   a first switching transistor comprising a gate configured to receive the first gate signal from the first buffer; and
   a second switching transistor comprising a gate configured to receive the first gate signal from the second buffer, a source connected to a source of the first switching transistor, a gate connected to the gate of the first switching transistor, and a body connected to a body of the first switching transistor.

* * * * *